United States Patent
Kim et al.

(10) Patent No.: US 8,174,921 B2
(45) Date of Patent: May 8, 2012

(54) SEMICONDUCTOR MEMORY DEVICE HAVING SHARED TEMPERATURE CONTROL CIRCUIT

(75) Inventors: Ho-Young Kim, Suwon-si (KR); Jung-Bae Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/589,674

(22) Filed: Oct. 27, 2009

(65) Prior Publication Data

US 2010/0157709 A1    Jun. 24, 2010

(30) Foreign Application Priority Data

Dec. 19, 2008 (KR) .................. 10-2008-0129854

(51) Int. Cl.
*G11C 7/00* (2006.01)
(52) U.S. Cl. ............... 365/222; 365/189.02; 365/211; 365/230.03; 365/230.02
(58) Field of Classification Search ............... 365/222, 365/211, 212, 230.03, 189.02, 230.02
See application file for complete search history.

(56) References Cited

U.S. PATENT DOCUMENTS

| | | | | |
|---|---|---|---|---|
| 5,959,923 A * | 9/1999 | Matteson et al. | ............. | 365/222 |
| 6,756,856 B2 * | 6/2004 | Song et al. | .................. | 331/176 |
| 6,879,536 B2 * | 4/2005 | Lee | .............. | 365/222 |
| 7,233,538 B1 * | 6/2007 | Wu et al. | ...................... | 365/222 |
| 7,590,473 B2 * | 9/2009 | Wyatt | ......................... | 700/299 |
| 2003/0056057 A1 | 3/2003 | Lawrence | | |
| 2006/0280012 A1 | 12/2006 | Perner | | |
| 2007/0191993 A1 | 8/2007 | Wyatt | | |

FOREIGN PATENT DOCUMENTS

JP    2007-220233 A    8/2007

* cited by examiner

*Primary Examiner* — Hoai V Ho
*Assistant Examiner* — Kretelia Graham
(74) *Attorney, Agent, or Firm* — Onello & Mello, LLP (57) ABSTRACT

A semiconductor memory device includes a plurality of memory banks; a plurality of temperature sensing circuits, and a shared control circuit. The temperature sensing circuits correspond to the memory banks and each is disposed in the vicinity of a corresponding memory bank. The shared control circuit is connected to the plurality of temperature sensing circuits and a plurality of refresh circuits for refreshing the plurality of memory banks, performs calibration on the plurality of temperature sensing circuits, performs digital processing on signals for separately controlling refresh intervals for the plurality of memory banks, and transmits the processed signals to the plurality of refresh circuits. Therefore, the refresh intervals for individual channels or banks are separately or selectively controlled. Further, since the plurality of temperature sensing circuits are connected to the shared temperature control circuit, the occupied area of the circuits in a chip is reduced or minimized.

10 Claims, 7 Drawing Sheets

SEMICONDUCTOR MEMORY DEVICE HAVING SHARED TEMPERATURE CONTROL CIRCUIT

CROSS-REFERENCE TO RELATED APPLICATIONS

This application claims the benefit of Korean Patent Application 10-2008-0129854, filed in the Korean Intellectual Property Office on Dec. 19, 2008, the contents of which are hereby incorporated by reference in their entirety as if fully set forth herein.

BACKGROUND

Embodiments of the present invention relate to a semiconductor memory device, and in particular, to a semiconductor memory device such as a dynamic random access memory (DRAM) having a temperature sensing circuit.

Various semiconductor devices, such as CPUs, memories, and gate arrays, implemented in integrated circuit chips are incorporated into various electrical products such as portable personal computers, PDAs, servers, workstations, etc. If such electrical products enter a sleep mode, most circuit components are turned off.

Semiconductor memory devices such as DRAMs are generally used as main memories for electrical systems and have unit memory cells each composed of one access transistor and one storage capacitor. Since semiconductor memory devices such as DRAM are volatile memories, in order to retain data stored in the memory cells, it is required to self-refresh data in the memory cells. Self refreshing results in power consumption. Demands for battery operated systems consuming a relatively smaller amount of power make it necessary to reduce power consumption.

One approach to reduce power consumption for self-refresh is to change a refresh interval in accordance with temperature. In DRAMs, as temperature becomes lower, a data retention period becomes longer. Accordingly, it is possible to divide a temperature range into two or more sub-ranges and decrease a frequency of a refresh clock with rising temperature, so as to reduce the power consumption. To this end, a low-power temperature sensing circuit is incorporated into a DRAM chip.

When a temperature sensing circuit is incorporated into a DRAM chip, a control circuit for calibrating the temperature sensing circuit, processing temperature-related data, and transmitting the processed data to a refresh circuit is incorporated as well. As the number of incorporated temperature sensing circuits and control circuits increases, more accurate temperature sensing and more precise refresh control become possible. However, it is difficult to incorporate a number of circuits without any restriction based on size.

For this reason, an improved technique for arranging circuits more effectively to reduce the occupied area of the circuits in a chip and perform precise refresh control is needed.

SUMMARY OF THE INVENTION

A feature of embodiments of the present invention provides a semiconductor memory device having a shared temperature control circuit.

Another feature of embodiments of the present invention provides a semiconductor memory device capable of separately or selectively controlling refresh intervals for every channel or bank.

A further feature of embodiments of the present invention provides a semiconductor memory device having a plurality of temperature sensing circuits and one shared temperature control circuit which are arranged to occupy a smaller area in a chip.

In accordance with an aspect of the invention, a semiconductor memory device includes a plurality of memory banks, a plurality of temperature sensing circuits, and a shared control circuit. The plurality of temperature sensing circuits correspond to the plurality of memory banks and each are disposed in the vicinity of a corresponding memory bank. The shared control circuit is connected to the plurality of temperature sensing circuits and a plurality of refresh circuits for refreshing the plurality of memory banks, performing calibration on the plurality of temperature sensing circuits, performing digital processing on signals for separately controlling refresh intervals for the plurality of memory banks, and transmitting the processed signals to the plurality of refresh circuits.

In the semiconductor memory device, the total number of memory banks may be four. The shared control circuit may perform the digital processing on the signals for separately controlling the refresh intervals for the plurality of memory banks in a time-division multiplexing scheme.

At least one of the plurality of memory banks may be a shared memory bank accessible by a plurality of processors. The semiconductor memory device may a multi-channel memory or a OneDRAM™.

In accordance with another aspect, a semiconductor memory device includes a plurality of memory banks, a plurality of temperature sensing circuits, and a shared control circuit. The plurality of memory banks includes at least one memory bank accessible by a plurality of processors. The plurality of temperature sensing circuits correspond to the plurality of memory banks and each is disposed in the vicinity of a corresponding memory bank. The shared control circuit is connected to the plurality of temperature sensing circuits and a plurality of refresh circuits for refreshing the plurality of memory banks, performing digital processing on signals for separately controlling refresh intervals for the plurality of memory banks, and transmitting the processed signals to the plurality of refresh circuits.

In the semiconductor memory device, the total number of memory banks may be four or eight. The shared control circuit may perform the digital processing on the signals for separately controlling the refresh intervals for the plurality of memory banks in a time-division multiplexing scheme.

The semiconductor memory device may be a multi-channel memory or a OneDRAM™.

According to the invention, the refresh intervals for every channel or bank are separately or selectively controlled. Further, since the plurality of temperature sensing circuits are connected to the shared temperature control circuit, the occupied area of the temperature sensing and shared temperature control circuits in a chip is reduced or minimized.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. The drawings are not necessarily to scale, emphasis instead being placed upon illustrating aspects of the invention.

DETAILED DESCRIPTION OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather these embodiments are provided so that this description will be thorough and complete, and will fully convey the invention to those skilled in the art.

Unless otherwise defined, all terms (including technical and scientific terms) used herein have the same meaning as commonly understood by one skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. are to be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Figure 1:
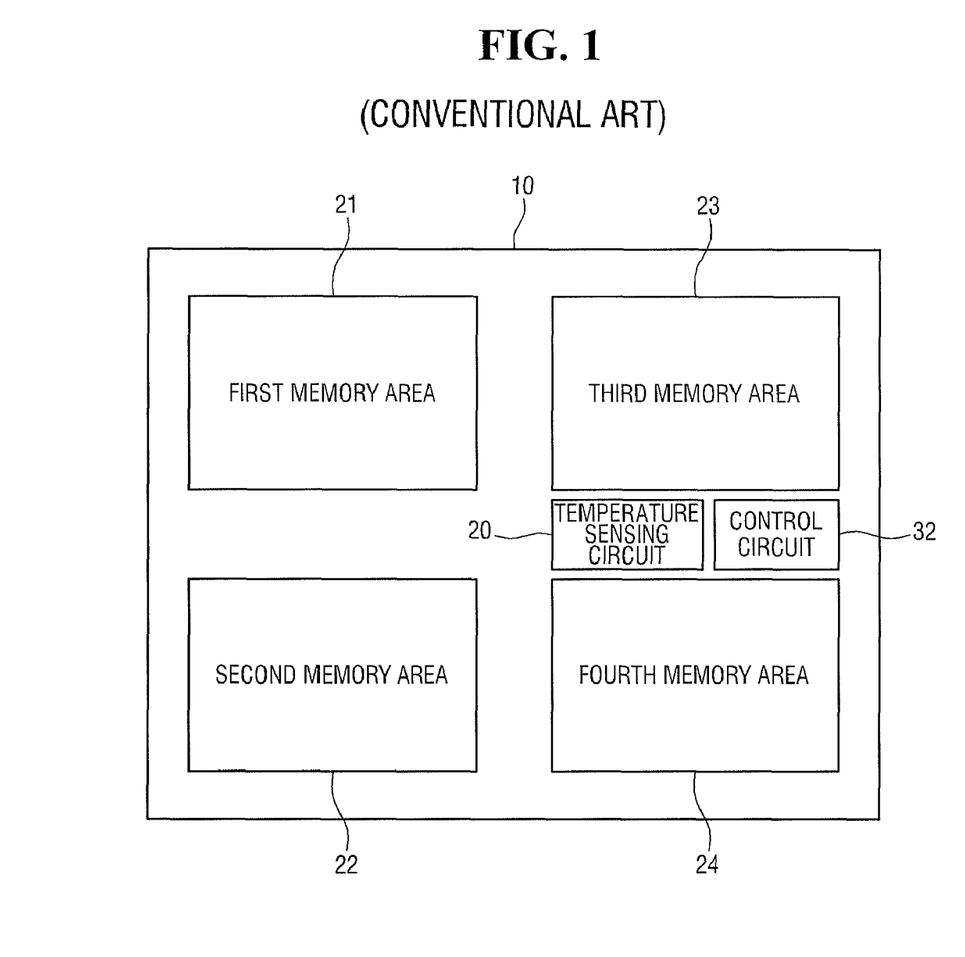
FIG. 1 is a block diagram schematically illustrating a semiconductor memory device having a temperature sensing circuit according to the related art.

FIG. 1 is a block diagram schematically illustrating a semiconductor memory device having a temperature sensing circuit according to the related art.

Referring to FIG. 1, four memory areas 21 to 24 are arranged in a semiconductor memory device 10. The four memory areas 21 to 24 may be memory banks or memory blocks. One temperature sensing circuit 20 and one control circuit 32 are disposed in a peripheral circuit area apart from the memory areas 21 to 24.

The control circuit 32 is electrically connected between the temperature sensing circuit 20 and a refresh circuit (not shown), calibrates the temperature sensing circuit 20, processes a signal for controlling a refresh interval, and transmits the signal to the refresh circuit.

However, controlling the refresh interval by use of one temperature sensing circuit 20 as shown in FIG. 1 may degrade the accuracy of refresh interval control. For example, when it is required to reduce the refresh interval for a first memory area 21 due to a high temperature thereof, the temperature sensing circuit 20 may be sensing the temperature of a third memory area 23, resulting in missing a correct refresh moment for the first memory area 21.

Figure 2:
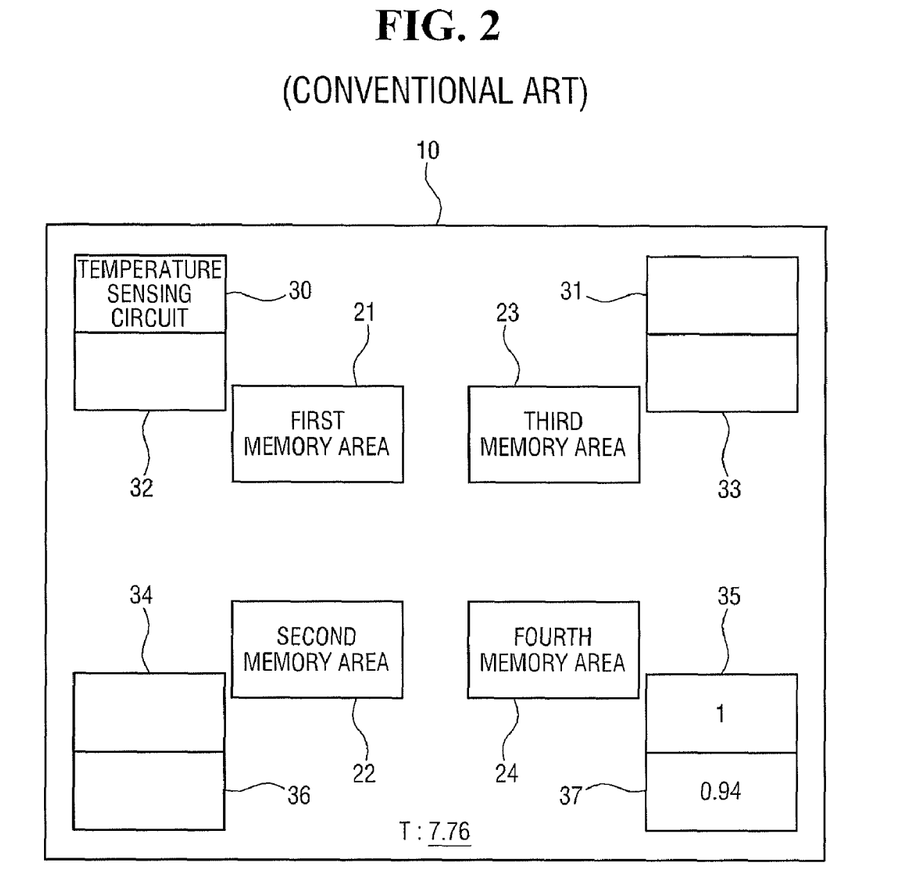
FIG. 2 is a block diagram illustrating a semiconductor memory device in which one temperature sensing circuit and one control circuit are assigned for every memory area according to the related art.

In order to cope with the above-mentioned problem, in the related art, one temperature sensing circuit and one control circuit are assigned for every memory area as shown in FIG. 2.

FIG. 2 is a block diagram illustrating a semiconductor memory device in which one temperature sensing circuit and one control circuit are assigned for every memory area according to the related art.

Referring to FIG. 2, when four memory areas 21 to 24 are arranged in a semiconductor memory device 10, a temperature sensing circuit 30 and a control circuit 32 are assigned to a first memory area 21, a temperature sensing circuit 34 and a control circuit 36 are assigned to a second memory area 22, a temperature sensing circuit 31 and a control circuit 33 are assigned to a third memory area 23, and a temperature sensing circuit 35 and a control circuit 37 are assigned to a fourth memory area 24.

Assuming that the area of each of the temperature sensing circuits 30, 34, 31, and 35 in FIG. 2 is 1, the area of each of the control circuits 32, 36, 33, and 37 is about 0.94. Therefore, the total occupied area of those circuits is 7.76(=1×4+0.94×4).

If one temperature sensing circuit and one control circuits are assigned to every memory area as shown in FIG. 2, the temperature sensing and control circuits occupies a large area in the semiconductor memory device.

In this case, refresh intervals for the memory areas are separately controlled. However, it is difficult to use one temperature sensing circuit to control two or more memory areas. If it is possible to use one temperature sensing circuit to control two or more memory areas, power saving is possible.

Figure 3:
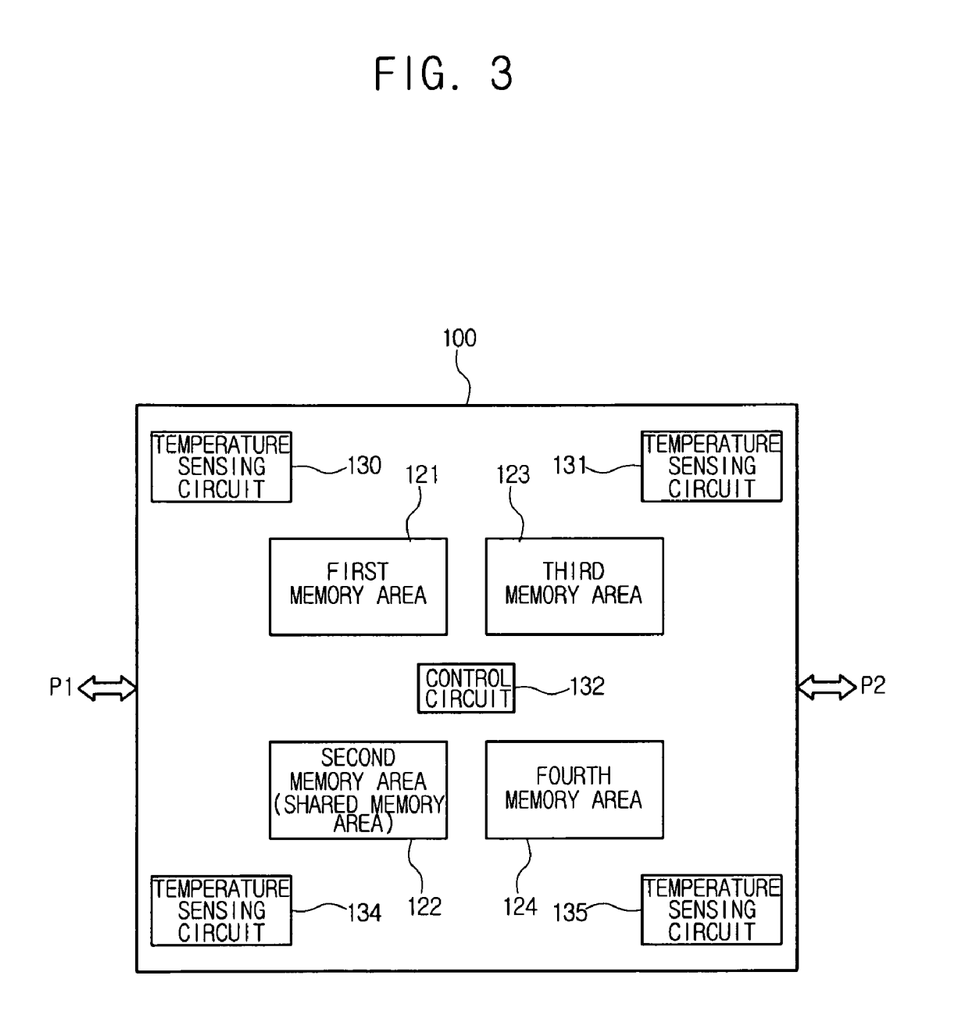
FIG. 3 is a block diagram illustrating a semiconductor memory device having a plurality of temperature sensing circuits and a shared temperature control circuit according an embodiment of the present invention.

According to embodiments of the present invention, one control circuit 132 is shared by four temperature sensing circuits 130, 134, 131 and 135 as shown in FIG. 3. As a result, these circuits occupy a smaller area in a chip.

Figure 5:
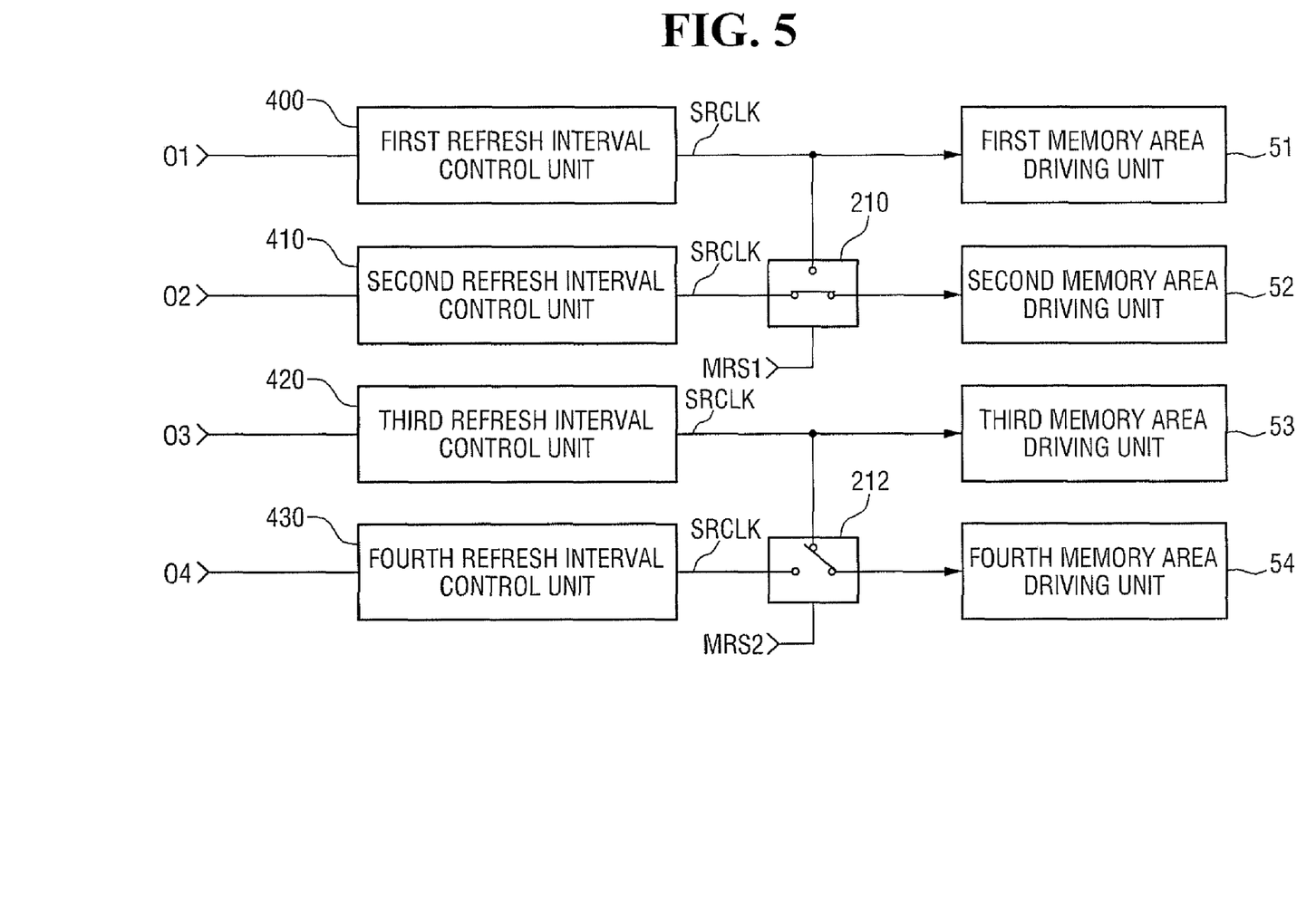
FIG. 5 is a block diagram illustrating an example in which refresh intervals for the memory areas shown in FIG. 3 are separately controlled.

Moreover, if a plurality of memory areas are selected in response to external control signals MRS1 and MRS2 as shown in FIG. 5 and refresh control on the plurality of memory areas is performed at the same time, the power consumption is reduced.

FIG. 3 is a block diagram illustrating a semiconductor memory device having a plurality of temperature sensing circuits and a shared temperature control circuit according an embodiment of the present invention.

When four memory areas 121 to 124 are arranged in a semiconductor memory device 100 as shown in FIG. 3, a temperature sensing circuit 130 is assigned to a first memory area 121, a temperature sensing circuit 134 is assigned to a second memory area 122, a temperature sensing circuit 131 is assigned to a third memory area 123, and a temperature sensing circuit 135 is assigned to a fourth memory area 124.

In one embodiment, control circuit 132 shared by the first to fourth temperature sensing circuits 130, 134, 131, and 135 is disposed in a central portion of the semiconductor memory device 100.

The four memory areas 121 to 124 may be banks in a DRAM and each bank may have storage capacity of, for example, 16 Mb, 32 Mb, 64 Mb, 128 Mb, 256 Mb, 512 Mb, or 1024 Mb.

Assuming that the area of each of the temperature sensing circuits 130, 134, 131, and 135 in FIG. 3 is 1, the area of the control circuit 132 is about 0.94. Therefore, the total occupied area of those circuits is 4.94(=1×4+0.94).

Consequently, if a plurality of temperature sensing circuits and one shared control circuit are arranged as shown in FIG. 3, the occupied area of the circuits in the semiconductor memory device is reduced by about 36%, as compared to that in the configuration shown in FIG. 2.

If the semiconductor memory device shown in FIG. 3 is a OneDRAM™, the second memory area 122 of the plurality of memory areas may be a shared memory bank accessible by a plurality of processors P1 and P2. According to some embodiments, the semiconductor memory device shown in FIG. 3 may be a multi-channel memory.

In the case of a OneDRAM™, memory banks and ports connected to system buses are provided therein so that at least one of a first processor or a second processor can access each of the memory banks through two different access paths. A OneDRAM™ is different from a general DRAM having one port in that it has a plurality of ports.

A OneDRAM™ is a fusion memory chip capable of increasing a data processing speed between a communication processor and a media processor in a mobile device. In general, if there are two processors, two memories are needed. In contrast, a OneDRAM™ solution can route data between processors through a single chip. Moreover, a OneDRAM™ substantially reduces an amount of time taken to transmit data between processors by use of a dual-port approach. In high-performance smart phones, multimedia rich-handsets, etc., a single OneDRAM™ module can be substituted for two mobile memory chips. As a data processing speed between processors increases, a OneDRAM™ can reduce power consumption by about 30%, reduce the number of necessary chips, and reduce total die area coverage by about 50%. As a result, an operation speed of a cellular phone increases by, for example, about five times, battery lifetime may be prolonged, and a handset design may become slimmer.

Assuming that the OneDRAM™ shown in FIG. 3 has a memory cell array composed of four memory areas, a first memory area 121 may be dedicatedly accessible by the first processor P1, and a third memory area 123 and a fourth memory area 124 may be dedicatedly accessible by the second processor P2. Moreover, a second memory area 122 may be accessible by the first processor P1 and the second processor P2 through different ports. That is, the second memory area 122 of the memory cell array may be assigned as a shared memory area and the first, third, and fourth memory areas are assigned as dedicated memory areas each accessible by a corresponding processor.

When the first processor P1 accesses the second memory area 122, a path control unit of the OneDRAM™ performs control such that the second memory area 122 is connected to the first processor P1. While the first processor P1 is accessing the second memory area 122, the second processor P2 can access the third memory area 123 or the fourth memory area 124 which is a dedicated memory area. When the first processor P1 is not accessing the second memory area 122, the second processor P2 can access the second memory area 122 which is a shared memory area.

The semiconductor memory device shown in FIG. 3 includes a plurality of memory areas 121 to 124, a plurality of temperature sensing circuits 130, 134, 131, and 135, and a control circuit 132. The temperature sensing circuits 130, 134, 131, and 135 correspond to the plurality of memory areas and each is disposed in the vicinity of a corresponding memory area. The control circuit 132 is shared by the temperature sensing circuits and is connected between the temperature sensing circuits and refresh circuits for performing refresh on the plurality of memory areas. The control circuit 132 calibrates the temperature sensing circuits, performs digital processing on signals for separately controlling refresh intervals for the plurality of memory banks, and transmits the processed signals to the refresh circuits.

The control circuit 132 may perform digital processing on the signals for separately controlling the refresh intervals for the plurality of memory banks by a time-division multiplexing scheme.

Figure 4:
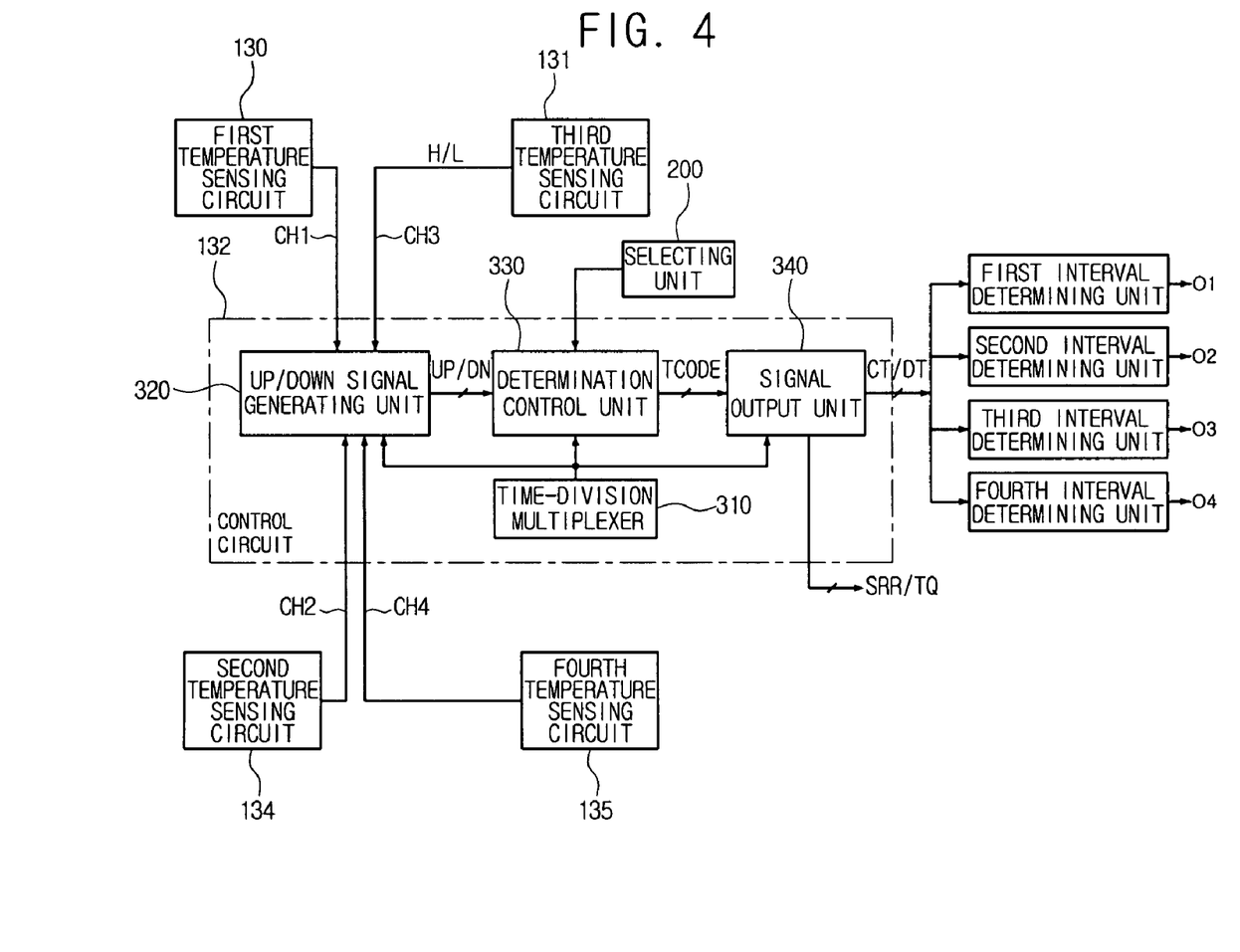
FIG. 4 is a block diagram illustrating a connection between the temperature sensing circuits and the shared control circuit shown in FIG. 3.

FIG. 4 is a block diagram illustrating connections between the temperature sensing circuits and the shared control circuit shown in FIG. 3. The control circuit 132 may include a UP/DOWN signal generating unit 320, a determination control unit 330, a signal output unit 340, and a time-division multiplexer 310. The signal output unit 340 is connected to a plurality of interval determining units for determining refresh intervals. In FIG. 4, four channels CH1 to CH4 are shown on the assumption that there are four memory areas.

In FIG. 4, the UP/DOWN signal generating unit 320 receives High/Low signals H/L from the temperature sensing circuits 130, 134, 131, and 135 through the channels CH1 to CH4. If receiving three consecutive High signals or three consecutive Low signals, the UP/DOWN signal generating unit 320 generates an UP/DOWN signal UP/DN. The determination control unit 330 receives the UP/DOWN signal UP/DN and generates temperature code data TCODE matched with temperatures, one-on-one. That is, when three consecutive High signals or three consecutive Low signals are received through the same channel, the temperature code data TCODE is updated. The signal output unit 340 receives the temperature code data TCODE, informs the exterior of the semiconductor memory device of temperature information corresponding to the individual channels as a SRR (status register read)/TQ (temperature output) signal, and transmits CT and DT codes, which are sensed temperature outputs, to interval determining units for the individual channels. The interval determining units receive the CT and DT codes and control a frequency of an oscillator in accordance with corresponding temperatures so as to control the refresh intervals.

The sensed temperature outputs vary in accordance with the temperatures of the memory areas and change the states of output control signals O1, O2, O3, and O4 of the interval determining units.

In FIG. 4, the time-division multiplexer 310 of internal blocks of the control circuit 132 is connected to the other internal blocks such that the other internal blocks receive and transmit data in a time-division multiplexing scheme.

Calibration circuit blocks for detecting shifted temperatures of the temperature sensing circuits and performing calibration are omitted in FIG. 4.

The shifted temperatures of the temperature sensing circuits may be detected by a binary successive approximation method, where detecting the shifted temperatures can be performed with a margin of error of 1 degree or less.

FIG. 5 is a block diagram illustrating an example in which refresh intervals for the memory areas shown in FIG. 3 are separately controlled.

In FIG. 5, a connection structure of first to fourth refresh interval control units 400, 410, 420, and 430, switching units 210 and 212, and first to fourth memory area driving units 51 to 54 is shown.

In the structures shown in FIG. 5, if a switch of a switching unit 210 connects the second memory area driving unit 52 to the first refresh interval control unit 400 in response to the external control signal MRS1, the second memory area driving unit 52 responds to a refresh clock from the first refresh interval control unit 400 and is not operationally connected to the second refresh interval control unit 410. To this end, a selection signal for selecting a memory bank to be controlled may be applied through a selecting unit 200 shown in FIG. 4. Then, a temperature sensing circuit corresponding to the selected memory bank may be turned off through a separate channel so as not to generate temperature code data for the selected memory bank.

In this way, memory areas may be selected according to the external control signals MRS1 and MRS2 and refresh interval control may be performed on the selected memory areas at the same time, resulting in a reduction in power consumption.

The external control signals may be a mode register set (hereinafter, referred to as "MRS") or an extended mode register set (hereinafter, referred to as "EMRS").

An example of a general technique for applying an EMRS command to control a refresh operation of a semiconductor memory device in accordance with a temperature thereof is disclosed in US. Patent Publication No. 2003/0056057, published Mar. 20, 2003, which can be referred to for applications of EMRS commands, incorporated herein in its entirety by reference.

In FIG. 5, the first to fourth refresh interval control units 400, 410, 420, and 430 generating self-refresh clocks SRCLK change the frequencies of the self-refresh clocks SRCLK in accordance with the temperatures, in response to the output control signals O1 to O4. The first to fourth memory area driving units 51 to 54 control a refresh operation of the memory cell array in response to the self-refresh clocks SRCLK, such that a refresh operation interval in the case of a higher temperature is longer than that in the case of a lower temperature.

Figure 6:
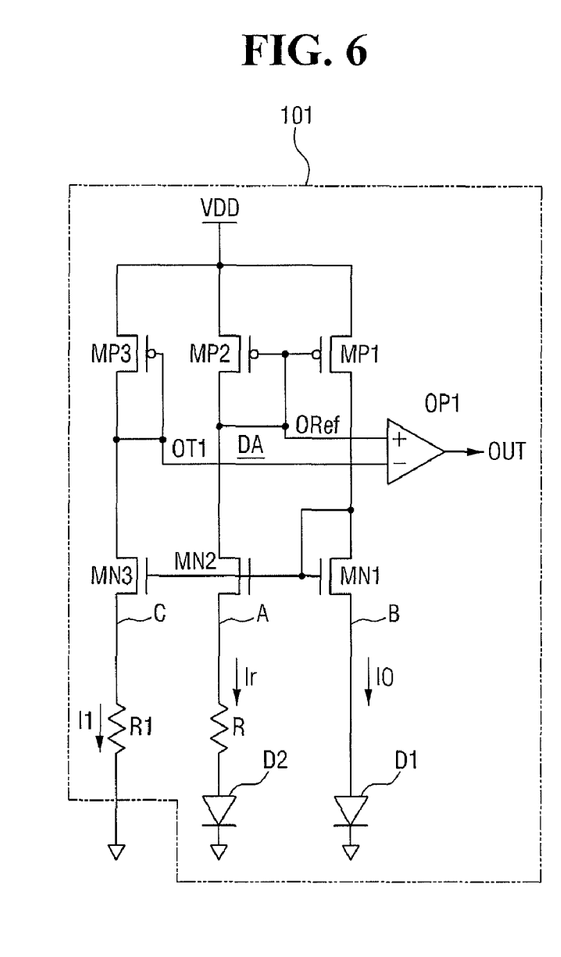
FIG. 6 is a diagram illustrating an example of a temperature sensing circuit applicable to the configuration shown in FIG. 3.
Figure 7:
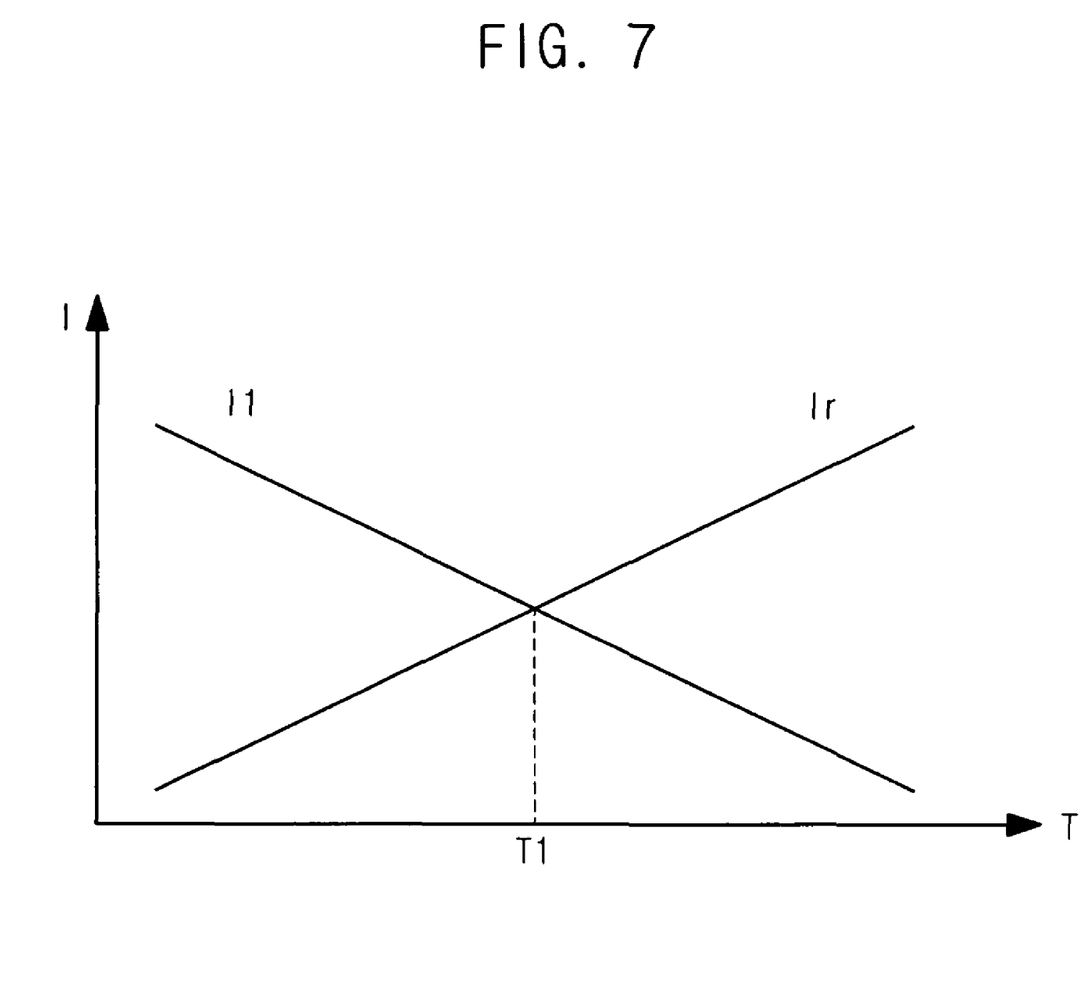
FIG. 7 is a graph exhibiting a temperature-versus-current characteristic of the temperature sensing circuit shown in FIG. 6.

FIG. 6 is a diagram illustrating an example of a temperature sensing circuit applicable to the configuration shown in FIG. 3, and FIG. 7 is a graph exhibiting a temperature-versus-current characteristic of the temperature sensing circuit shown in FIG. 6.

Hereinafter, a temperature sensing circuit shown in FIG. 3 will be described further with reference to FIGS. 6 and 7.

In FIG. 6, a configuration of a temperature sensing circuit using a general band-gap reference circuit is shown. Referring to FIG. 6, a temperature sensing circuit 101 includes a current mirror type differential amplifier DA, a negative temperature coefficient resistor R1 in which a smaller amount of current flows at a higher temperature, a positive temperature coefficient resistor R in which a larger amount of current flows at a higher temperature, and a comparator OP1 which compares a sensed temperature OT1 with a reference temperature ORef and outputs the comparison result as a comparison output signal OUT. Junction diodes D2 and D1, connected to a branch A and a branch B, respectively, are of the same kind. The ratio of sizes of PMOS transistors MP1, MP2, and MP3 is 1:1:1, and the ratio of sizes of NMOS transistors MN1, MN2, and MN3 is 1:1:1, where the term size means a product of a channel length L and a gate width W.

The operation of the temperature sensing circuit shown in FIG. 6 will now be described. During a current mirror operation of PMOS transistors MP1 and MP2 and NMOS transistors MN1 and MN2 of the differential amplifier DA, equal currents Ir and IO flow through the branch A and the branch B, respectively, (IO:Ir=1:1) and thus the voltage of the branch A is the same as the voltage of the branch B (VA=VB).

A current I of a junction diode in a turned-on section is expressed as $$I=Is\{e(VD/VT)-1\} \approx Is*e(VD/VT)$$

where Is denotes an inverse saturation current, VD denotes the diode voltage, and VT denotes a thermal voltage which is equal to kT/q.

Since the voltage of the branch A is the same as the voltage of the branch B (VA=VB), it follows that VD1=VD2+Ir*R where VD1 denotes the voltage across the diode D1, VD2 denotes the voltage across the diode D2, Ir is a current flowing through the branch A, and R denotes the resistance value of the resistor R.

If the diode D1 is turned on to satisfy a condition of IO=Is*e(VD1/VT), it follows that VD1=VT*ln(IO/Is), and if the diode D2 is turned on to satisfy a condition of Ir=Is*e (VD2/VT), it follows that VD2=VT*ln(Ir/Is)=VT*ln(M*IO/Is). Thus, it follows that VT*ln(IO/Is)=VT*ln(M*IO/Is)+Ir*R, where M denotes a size ratio of the diodes D1 and D2.

From the above equations, the following relationship is established: Ir=VT*ln(M)/R. Therefore, the current Ir flowing through the branch A is proportional to temperature. Also, if a current I1 flowing through a branch C is substantially equal to the current IO flowing through the branch B, the voltage of the branch C is substantially the same as the voltage VB and then it follows that VB=VD1=VT*ln(IO/Is).

In general, the inverse saturation current Is increases with rising temperature to a much greater extent than the thermal voltage VT, and accordingly, the diode voltage drops with falling temperature. Therefore, the voltage VC also drops with rising temperature, whereby the current I1 decreases with rising temperature.

Therefore, it is possible to make the current Ir become equal to the current I1 at a specific temperature (which is T1 in FIG. 7) by controlling the resistance value of the resistor R1. That is, the temperature sensing circuit may be designed to have a trip point at a specific temperature (for example, T1). FIG. 7 shows the temperature-versus-current characteristics of the branch C and branch A of the temperature sensing circuit, where the horizontal axis denotes temperature and the vertical axis denotes current. At the trip point T1, a graph of the characteristic of the branch C intersects with a graph of the characteristic of the branch A.

The temperature sensing circuits of FIG. 6 are highly sensitive to variations in the fabrication processes. Particularly, an actual trip point may differ from a designed trip point by a certain amount (referred to herein as a "amount of temperature shift"). In order to compensate for this amount of temperature shift, a temperature tuning process should be performed on individual chips on a wafer. During the temperature tuning process, in order to perform temperature trimming, it is first necessary to detect the amount of temperature shift due to variations in the fabrication processes. The amount of temperature shift of the temperature sensing circuit may be detected by placing the wafer in a process chamber and varying an interior temperature of the process chamber while monitoring the comparison output signal OUT of the comparator OP1. After the amount of temperature shift is detected, the temperature trimming is performed by using the resistors.

In the above-described embodiments, the control signals applied to the switching units are MRS or EMRS commands supplied from an external CPU or memory controller connected to the semiconductor memory device. However, in some embodiments, other logic signals may be used as the control signals applied to the switching units. Further, in the above-described embodiments, the band-gap reference type temperature sensing circuit is used. However, other types of temperature sensing circuits may be used.

In the drawings and specification, there have been described embodiments of the invention and, although specific terms are employed, they are used in a generic and descriptive sense only and not for limitation, the inventive scope being set forth in the following claims. For example, the configuration of the control circuit or the internal connection structure may be modified without deviating from the intent of the present invention.

Moreover, the application to a DRAM has been described above. However, the present invention is applicable to other volatile memories such as Pseudo SRAM, etc.

What is claimed is:

1. A semiconductor memory device comprising:
a plurality of memory banks;
a plurality of temperature sensing circuits corresponding to the plurality of memory banks, each of the plurality of temperature sensing circuits being disposed in the vicinity of a corresponding memory bank; and
a shared control circuit directly connected to the plurality of temperature sensing circuits and connected to a plurality of refresh circuits for refreshing the plurality of memory banks, the shared control circuit performing calibration on the plurality of temperature sensing circuits, performing digital processing on signals for separately controlling refresh intervals for the plurality of memory banks, and transmitting the processed signals to the plurality of refresh circuits,
wherein the plurality of refresh circuits receive sensed temperature outputs from the shared control circuit, and
wherein first and second refresh circuits of the plurality of refresh circuits are connected by a switch such that memory banks are selected according to external control signals and refresh interval control may be performed on selected memory banks at the same time.

2. The circuit of claim 1, wherein the total number of memory banks is four.

3. The circuit of claim 1, wherein the shared control circuit performs the digital processing on the signals for separately controlling the refresh intervals for the plurality of memory banks in a time-division multiplexing scheme.

4. The circuit of claim 1, wherein at least one of the plurality of memory banks is a shared memory bank accessible by a plurality of processors.

5. The circuit of claim 1, wherein the semiconductor memory device is a multi-channel memory.

6. A semiconductor memory device comprising:
a plurality of memory banks including at least one memory bank accessible by a plurality of processors;
a plurality of temperature sensing circuits corresponding to the plurality of memory banks, each of the plurality of temperature sensing circuits being disposed in the vicinity of a corresponding memory bank; and
a shared control circuit directly connected to the plurality of temperature sensing circuits and connected to a plurality of refresh circuits for refreshing the plurality of memory banks, the shared control circuit performing digital processing on signals for separately controlling refresh intervals for the plurality of memory banks, and transmitting the processed signals to the plurality of refresh circuits,
wherein the plurality of refresh circuits receive sensed temperature outputs from the shared control circuit, and
wherein first and second refresh circuits of the plurality of refresh circuits are connected by a switch such that memory banks are selected according to external control signals and refresh interval control may be performed on selected memory banks at the same time.

7. The semiconductor memory device of claim 6, wherein the total number of memory banks is four.

8. The semiconductor memory device of claim 6, wherein the shared control circuit performs the digital processing on the signals for separately controlling the refresh intervals for the plurality of memory banks in a time-division multiplexing scheme.

9. The semiconductor memory device of claim 6, wherein the semiconductor memory device is a multi-channel memory.

10. The semiconductor memory device of claim 6, wherein the semiconductor memory device is a fusion memory chip having the plurality of memory banks and ports connected to a system bus so that at least one of a first processor and a second processor can access each of the plurality of memory banks through two different access paths.

* * * * *